United States Patent
Chen et al.

(10) Patent No.: US 12,215,427 B2
(45) Date of Patent: Feb. 4, 2025

(54) EROSION AND CMAS RESISTANT COATING FOR PROTECTING EBC AND CMC LAYERS AND THERMAL SPRAY COATING METHOD

(71) Applicant: OERLIKON METCO (US) INC., Westbury, NY (US)

(72) Inventors: Dianying Chen, Westbury, NY (US); Chris Dambra, Greenlawn, NY (US)

(73) Assignee: OERLIKON METCO (US) INC., Westbury, NY (US)

( * ) Notice: Subject to any disclaimer, the term of this patent is extended or adjusted under 35 U.S.C. 154(b) by 80 days.

(21) Appl. No.: 16/954,741

(22) PCT Filed: Dec. 18, 2018

(86) PCT No.: PCT/US2018/066239
§ 371 (c)(1),
(2) Date: Jun. 17, 2020

(87) PCT Pub. No.: WO2019/126174
PCT Pub. Date: Jun. 27, 2019

(65) Prior Publication Data
US 2021/0087695 A1   Mar. 25, 2021

Related U.S. Application Data

(60) Provisional application No. 62/607,514, filed on Dec. 19, 2017.

(51) Int. Cl.
C23C 28/04 (2006.01)
C23C 4/11 (2016.01)
(Continued)

(52) U.S. Cl.
CPC ............. *C23C 28/042* (2013.01); *C23C 4/11* (2016.01); *C23C 4/134* (2016.01); *C23C 14/083* (2013.01);
(Continued)

(58) Field of Classification Search
CPC ........ C23C 4/11; C23C 14/083; C23C 28/042
(Continued)

(56) References Cited

U.S. PATENT DOCUMENTS 5,073,433 A * 12/1991 Taylor .................. C23C 4/02
501/39
5,830,586 A   11/1998 Gray
(Continued)

FOREIGN PATENT DOCUMENTS

CN   106061655   10/2016
EP   3453781   3/2015
(Continued)

OTHER PUBLICATIONS

Rao, S., Frederick, L. & McDonald, A. Resistance of Nanostructured Environmental Barrier Coatings to the Movement of Molten Salts. J Therm Spray Tech 21, 887-899 (2012). (Year: 2012).*
(Continued)

*Primary Examiner* — Elizabeth Collister
(74) *Attorney, Agent, or Firm* — GREENBLUM & BERNSTEIN, P.L.C.

(57) ABSTRACT

An erosion and CMAS resistant coating arranged on an EBC coated substrate includes at least one porous vertically cracked (PVC) coating layer providing CTE mitigation and being disposed over the EBC coated substrate. At least one dense vertically cracked (DVC) erosion and CMAS resistant coating layer is deposited over the at least one PVC coating layer.

29 Claims, 2 Drawing Sheets

(51) Int. Cl.
*C23C 4/134* (2016.01)
*C23C 14/08* (2006.01)
*C23C 28/00* (2006.01)
*F01D 5/28* (2006.01)

(52) U.S. Cl.
CPC ........ *C23C 28/321* (2013.01); *C23C 28/3455* (2013.01); *F01D 5/288* (2013.01)

(58) Field of Classification Search
USPC .......................................... 428/697, 701, 702
See application file for complete search history.

(56) References Cited

U.S. PATENT DOCUMENTS

| | | | |
|---|---|---|---|
| 6,177,200 B1 | 1/2001 | Maloney | |
| 6,284,325 B1 | 9/2001 | Eaton, Jr. | |
| 6,296,941 B1 | 10/2001 | Eaton, Jr. | |
| 6,387,456 B1 | 5/2002 | Eaton, Jr. | |
| 6,703,137 B2 | 3/2004 | Subramanian | |
| 6,733,908 B1 | 5/2004 | Lee | |
| 7,740,960 B1 | 6/2010 | Zhu | |
| 7,875,370 B2 | 1/2011 | Schlichting | |
| 7,910,172 B2 | 3/2011 | Meschter | |
| 8,197,950 B2 | 6/2012 | Taylor | |
| 9,023,486 B2 | 5/2015 | Nagaraj | |
| 2003/0203224 A1* | 10/2003 | DiConza | F01D 5/288 428/472 |
| 2006/0115659 A1* | 6/2006 | Hazel | C23C 28/36 427/446 |
| 2008/0145674 A1* | 6/2008 | Darolia | F01D 5/288 428/433 |
| 2009/0176059 A1 | 7/2009 | Namba | |
| 2010/0136349 A1* | 6/2010 | Lee | C04B 41/52 428/411.1 |
| 2010/0158680 A1 | 6/2010 | Kirby et al. | |
| 2011/0038710 A1 | 2/2011 | Kemppainen et al. | |
| 2011/0086177 A1* | 4/2011 | Ma | C23C 4/134 427/398.1 |
| 2012/0003449 A1 | 2/2012 | Hongoh | |
| 2013/0224457 A1* | 8/2013 | Lee | C09D 1/02 428/332 |
| 2013/0344319 A1 | 12/2013 | Zhu | |
| 2014/0065438 A1 | 3/2014 | Lee | |
| 2014/0178632 A1 | 6/2014 | Taylor | |
| 2014/0272197 A1 | 9/2014 | Lee | |
| 2015/0147524 A1 | 5/2015 | Petorak | |
| 2016/0017749 A1 | 1/2016 | Luthra | |
| 2016/0215631 A1 | 7/2016 | Wan | |
| 2016/0348226 A1 | 12/2016 | Chen et al. | |
| 2017/0145836 A1* | 5/2017 | Sivaramakrishnan | C23C 4/11 |
| 2017/0362692 A1* | 12/2017 | Wolfe | C23C 10/52 |
| 2019/0032189 A1 | 1/2019 | Chen et al. | |
| 2019/0078215 A1 | 3/2019 | Wessels et al. | |
| 2019/0242001 A1* | 8/2019 | Bernard | F01D 9/04 |

FOREIGN PATENT DOCUMENTS

| | | |
|---|---|---|
| JP | 2011-032167 | 2/2011 |
| JP | 2011-508092 | 3/2011 |
| JP | 212-512809 | 6/2012 |
| JP | 4959213 | 6/2012 |
| JP | 2013-095973 | 5/2013 |
| JP | 2015-166479 | 9/2015 |
| JP | 2015-193872 | 11/2015 |
| JP | 2016-540890 | 12/2016 |
| JP | 2017-515968 | 6/2017 |
| WO | 2015/127052 | 8/2015 |
| WO | 2017/031163 | 2/2017 |
| WO | 2016/129521 | 12/2017 |

OTHER PUBLICATIONS

Viswanathan et al., "Multilayer, Multimaterial Thermal Barrier Coating Systems: Design, Synthesis, and Performance Assessment", Journal of the American Ceramic Society 98.6, Mar. 25, 2015, pp. 1769-1777.
Ganvir et al., "Characterization of Microstructure and Thermal Properties of YSZ Coatings Obtained by Axial Suspension Plasma Spraying (ASPS)", Journal of Thermal Spray Technology 24.7 , Jun. 24, 2015, pp. 1195-1204.
International Search Report (Form PCT/ISA/210) conducted in Int'l Appln. No. PCT/US2018/66239 (Mar. 15, 2019).
International Written Opinion (Form PCT/ISA/237) conducted in Int'l Appln. No. PCT/US2018/66239 (Mar. 15, 2019).
Europe Search Report/Office Action conducted in counterpart Europe Appln. No. 18890386.8 (Jun. 22, 2021).
China Search Report/Office Action conducted in counterpart China Appln. No. 201880078962.5 (May 9, 2022).
Japan Office Action conducted in counterpart Japan Appln. No. 2020-529721 (Dec. 6, 2022).

* cited by examiner

EROSION AND CMAS RESISTANT COATING FOR PROTECTING EBC AND CMC LAYERS AND THERMAL SPRAY COATING METHOD

CROSS-REFERENCE TO RELATED APPLICATIONS

The instant application claims priority under 35 U.S.C. § 119(e) of U.S. provisional Patent Application No. 62/607,514 filed on Dec. 19, 2017. The disclosure of which is expressly incorporated by reference herein in its entirety.

STATEMENT REGARDING SPONSORED RESEARCH OR DEVELOPMENT

Not Applicable.

BACKGROUND OF THE INVENTION

Field of the Invention

The invention is an erosion and Calcium-Magnesium-Aluminum-Silicate (CMAS) resistant multilayer ceramic coating for the protection of environmental barrier coating (EBC) that overlies a ceramic matrix composite (CMC) substrate. The multilayer coating can include an erosion and CMAS resistant dense vertically cracked (DVC) top coat and a coefficient of thermal expansion (CTE) mitigation porous vertically cracked (PVC) intermediate coating. A coating method is also disclosed.

Description of Related Art

Environmental barrier coatings (EBCs) have been applied onto Si-based ceramic matrix composite (CMC) layers for the protection of the CMC from oxidation and water vapor attack. In a high temperature gas turbine engine environment, foreign object damage can occur. In addition, such coatings are subject to CMAS dust penetration. Reactions with the EBC can also occur which can cause the EBC to spall. This can result in the loss of protection for the underlying CMC substrate. Thus, there is a need to improve the erosion and CMAS resistance of the EBC/CMC coating system.

It is also known in the art to employ yttrium stabilized zirconia (YSZ) thermal barrier coatings and these have been successfully used in the gas turbine engines for decades. However, YSZ coatings and layers typically have a large CTE which is in the range of ~10×10$^{-6}$/degrees C., and cannot be used directly onto the low CTE CMC layers which typically have a CTE of ~4×10$^{-6}$/degrees C.

The following documents, which are each herein expressly incorporated by reference in their entireties, disclose various types of DVC coatings; U.S. Pat. No. 8,197,950 to Taylor, issued on Jun. 12, 2012; U.S. Pat. No. 5,073,433 to Taylor, issued on Dec. 17, 1991; US 2014/0178632 to Taylor, published on Jun. 26, 2014; U.S. Pat. No. 5,830,586 to Gray, issued on Nov. 3, 1998; and U.S. Pat. No. 6,703,137 to Subramanian, issued on Mar. 9, 2004.

The following documents, which are each herein expressly incorporated by reference in their entireties, disclose various types of CMAS resistant coatings; U.S. Pat. No. 6,177,200 to Maloney, issued on Jan. 23, 2001; U.S. Pat. No. 7,875,370 to Schlichting, issued on Jan. 25, 2011; US 2012/0034491 to Hongoh, published on Feb. 9, 2012; and U.S. Pat. No. 9,023,486 to Nagaraj, issued on May 5, 2015.

The following document, which is herein expressly incorporated by reference in its entirety, discloses a PVC coating; US 2016/0348226 to Chen, published on Dec. 1, 2016.

The following documents, which are each herein expressly incorporated by reference in their entireties, disclose various types of EBC coatings; U.S. Pat. No. 6,296,941 to Eaton, Jr., issued on Oct. 2, 2001; U.S. Pat. No. 6,284,325 to Eaton, Jr., issued on Sep. 4, 2001; U.S. Pat. No. 6,387,456 to Eaton, Jr., issued on May 14, 2002; U.S. Pat. No. 6,733,908 to Lee, issued on May 11, 2004; U.S. Pat. No. 7,740,960 to Zhu, issued on Jun. 22, 2010; US 2010/0158680 to Kirby, published on 2010/0158680; U.S. Pat. No. 7,910,172 to Meschter, issued on Mar. 22, 2011; US 2016/0215631 to Wan, published on Jul. 28, 2016; US 2016/0017749 to Luthra, published on Jan. 21, 2016; US 2014/0272197 to Lee, published on Sep. 18, 2014; US 2014/0065438 to Lee, published on Mar. 6, 2014; US 2014/0272197 to Lee, published on Sep. 18, 2014; and US 2013/0344319 to Zhu, published on Dec. 26, 2013.

SUMMARY OF THE INVENTION

The invention encompasses an erosion and CMAS resistant ceramic coating for the protection of EBC that overlies a CMC substrate. A coating method is also disclosed.

The invention also encompasses a coating system wherein one or more EBC layers are first applied onto a CMC substrate. Then, one or more CTE mitigation layers are applied which are porous vertically cracked (PVC) coating layers. Finally, one or more dense vertically cracked (DVC) erosion and CMAS resistant coating layers are applied or deposited as a top layer.

In embodiments, the porosity of the DVC layer(s) can be 0% to 5% and the cracks can extend either partially through the thickness of the layer(s), i.e., less than 50% of the thickness, or about 50% of the thickness, and can even extend through an entire thickness of the layer(s). In embodiments, the cracks can be substantially vertical cracks and can range between 20 and 200 cracks per inch.

In embodiments, the porosity of the PVC layer(s) can be 5% to 25% and the cracks can extend either partially through the thickness of the layer(s), i.e., less than 50% of the thickness, or about 50% of the thickness, and can even extend through an entire thickness of the layer(s). In embodiments, the cracks can be substantially vertical cracks and can range between 20 and 200 cracks per inch.

With this invention, the EBC/CMC component life can be extended which extends and improves engine working life.

In embodiments of the present disclosure, a strain tolerant DVC coating top layer and the underlying PVC coating system is used to protect the EBC/CMC. The DVC/PVC layers can be composed of tough rare earth element (Re) stabilized $ZrO_2$ or $HfO_2$ mixed with a CMAS resistant chemistry composition. As used herein, CMAS resistant chemistry means any chemical composition that can react with the CMAS dust and form a crystalline phase to prevent the CMAS further penetration to the coating or the chemical composition which can improve the CMAS melting temperature after reacted with CMAS. The DVC layers provide erosion resistant and the PVC layers provide the CTE mitigation between the high CTE top layer and the low CTE bottom layers of EBC.

Main advantages of the invention include the tough Re stabilized $ZrO_2$ or $HfO_2$ mixed with CMAS resistant chemistry to improve the erosion and CMAS resistance of the EBC/CMC system. In addition, a PVC strain tolerant transition layer provides CTE mitigation between the high CTE top layer and the low CTE bottom layer EBC. Next, PVC microstructure further reduces thermal conductivity of the EBC/CMC system.

Non-limiting embodiments of the DVC top layer(s) and/or the PVC layer(s), with the DVC being erosion and CMAS resistant and with the PVC being a thermal barrier and CTE mitigation layer, include the following (with exemplary rare earth oxides including Yttrium oxide, Lanthanum oxide, Cerium oxide, Praseodymium oxide, Neodymium oxide, Samarium oxide, Europium oxide, Gadolinium oxide, terbium oxide, Dysprosium oxide, holmium oxide, erbium oxide, ytterbium oxide, Lutetium oxide, Scandium oxide, Thulium oxide):

Re stabilized $ZrO_2$ or $HfO_2$ mixture with Rare earth oxides; or

Re stabilized $ZrO_2$ or $HfO_2$ mixture with Rare earth Silicate; or

Re stabilized $ZrO_2$ or $HfO_2$ mixture with Rare earth Aluminate; or

Re stabilized $ZrO_2$ or $HfO_2$ mixture with Rare earth Aluminate Silicate; or

Re stabilized $ZrO_2$ or $HfO_2$ mixture with alkaline oxides; or

Re stabilized $ZrO_2$ or $HfO_2$ mixture with Gadolinium Zirconate; or

Any combination of the above.

The DVC top layer(s) or coating can have a CTE of $\sim 10 \times 10^{-6}$/degrees C., as well as a thickness of between 2 mils (0.002 inches) and 40 mils (0.040 inches). As used herein, a mil is equal to 0.001 inches. This layer or coating can be applied by atmospheric plasma spraying (APS), plasma spray-physical vapor deposition (PS-PVD) or suspension plasma spray (SPS).

The PVC intermediate layer(s) or coating can have a CTE of $\sim 10 \times 10^{-6}$/degrees C., as well as a thickness of between 1 mil and 40 mils. This layer or coating can be applied by atmospheric plasma spraying (APS), plasma spray-physical vapor deposition (PS-PVD) or suspension plasma spray (SPS).

The EBC layer(s) or coating can have a CTE of $3.5 \times 10^{-6}$/degrees C. to $7 \times 10^{-6}$/degrees C., as well as a thickness of between 1 mil and 40 mils. This layer or coating can be applied by atmospheric plasma spraying (APS), plasma spray-physical vapor deposition (PS-PVD) or suspension plasma spray (SPS).

The bond coating layer(s) or coating can be Si, Si—$HfO_2$, Si— Re and can have a CTE of $3.5 \times 10^{-6}$/degrees C. to $4.5 \times 10^{-6}$/degrees C., as well as a thickness of between 0 mils (no bond coating layer) and 10 mils. This layer or coating can be applied by atmospheric plasma spraying (APS), plasma spray-physical vapor deposition (PS-PVD) or suspension plasma spray (SPS).

The CMC or substrate can have a CTE of $\sim 4.5 \times 10^{-6}$/degrees C. to $5.5 \times 10^{-6}$/degrees C., as well as a thickness of greater than 40 mils. The substrate can be a SiC or $Si_3N_4$ material.

Non-limiting embodiments of the invention include an erosion and CMAS resistant coating arranged on an EBC coated substrate, comprising at least one porous vertically cracked (PVC) coating layer providing CTE mitigation and being disposed over the EBC coated substrate and at least one dense vertically cracked (DVC) erosion and CMAS resistant coating layer deposited over the at least one PVC coating layer.

In non-limiting embodiments, the at least one DVC layer is a top layer. The coating layer may further comprise at least one bond coating layer disposed between the EBC and the substrate. The substrate may be a ceramic matrix composite (CMC) substrate.

The at least one dense vertically cracked (DVC) erosion and CMAS resistant coating layer may comprise Re stabilized $ZrO_2$ or $HfO_2$ mixed with rare earth oxide. The at least one dense vertically cracked (DVC) erosion and CMAS resistant coating layer may comprise Re stabilized $ZrO_2$ or $HfO_2$ mixed with rare earth silicate. The at least one dense vertically cracked (DVC) erosion and CMAS resistant coating layer may comprise Re stabilized $ZrO_2$ or $HfO_2$ mixed with rare earth aluminate. The at least one dense vertically cracked (DVC) erosion and CMAS resistant coating layer may comprise Re stabilized $ZrO_2$ or $HfO_2$ mixed with rare earth aluminate or silicate. The at least one dense vertically cracked (DVC) erosion and CMAS resistant coating layer may comprise Re stabilized $ZrO_2$ or $HfO_2$ mixed with alkaline oxide. The at least one dense vertically cracked (DVC) erosion and CMAS resistant coating layer may comprise Re stabilized $ZrO_2$ or $HfO_2$ mixed with gadolinium zirconate. The at least one dense vertically cracked (DVC) erosion and CMAS resistant coating layer may comprise a mixture of one or more compositions described above.

The at least one dense vertically cracked (DVC) erosion and CMAS resistant coating layer may comprise full thickness vertical cracks. The at least one porous vertically cracked (PVC) coating layer may comprise full thickness vertical cracks.

Non-limiting embodiments of the invention include an erosion and CMAS resistant coating arranged on an EBC coated substrate, comprising at least one porous vertically cracked (PVC) thermal barrier coating layer providing CTE mitigation and being disposed over the EBC coated substrate and a top layer of dense vertically cracked (DVC) erosion and CMAS resistant coating material deposited over the at least one PVC thermal barrier coating layer.

In non-limiting embodiments, the coating may further comprise at least one bond coating layer disposed between the EBC and the substrate. The substrate may be a ceramic matrix composite (CMC) substrate.

The at least one dense vertically cracked (DVC) erosion and CMAS resistant coating layer may comprise Re stabilized $ZrO_2$ or $HfO_2$ mixed with rare earth oxide. The at least one dense vertically cracked (DVC) erosion and CMAS resistant coating layer may comprise Re stabilized $ZrO_2$ or $HfO_2$ mixed with rare earth silicate. The at least one dense vertically cracked (DVC) erosion and CMAS resistant coating layer may comprise Re stabilized $ZrO_2$ or $HfO_2$ mixed with rare earth aluminate. The at least one dense vertically cracked (DVC) erosion and CMAS resistant coating layer may comprise Re stabilized $ZrO_2$ or $HfO_2$ mixed with rare earth aluminate or silicate. The at least one dense vertically cracked (DVC) erosion and CMAS resistant coating layer may comprise Re stabilized $ZrO_2$ or $HfO_2$ mixed with alkaline oxide. The at least one dense vertically cracked (DVC) erosion and CMAS resistant coating layer may comprise Re stabilized $ZrO_2$ or $HfO_2$ mixed with gadolinium zirconate. The at least one dense vertically cracked (DVC) erosion and CMAS resistant coating layer may comprise a mixture of one or more compositions described above.

The at least one dense vertically cracked (DVC) erosion and CMAS resistant coating layer may comprise full thickness vertical cracks. The at least one porous vertically cracked (PVC) coating layer may comprise full thickness vertical cracks.

Non-limiting embodiments of the invention include an erosion and CMAS resistant ceramic coating arranged on a CMC substrate, comprising an EBC coating layer bonded to the substrate, a porous vertically cracked (PVC) ceramic coating layer providing CTE mitigation and being directly deposited on the EBC coating layer and a dense vertically cracked (DVC) erosion and CMAS resistant coating layer deposited directly on the PVC coating layer.

Non-limiting embodiments of the invention include a method of plasma spraying an erosion and CMAS resistant coating on an EBC coated substrate, comprising depositing at least one porous vertically cracked (PVC) thermal barrier coating layer providing CTE mitigation onto the EBC coated substrate and depositing a dense vertically cracked (DVC) erosion and CMAS resistant coating material over the at least one PVC thermal barrier coating layer.

In embodiments, the EBC coated substrate may comprise at least one bond coating layer arranged between an EBC layer and the substrate. The plasma spraying may comprise one of atmospheric plasma spraying (APS), plasma spray-physical vapor deposition (PS-PVD), or suspension plasma spray (SPS).

BRIEF DESCRIPTION OF THE DRAWINGS

The accompanying drawings are included to provide further understanding of the invention and are incorporated in and constitute a part of this specification. The accompanying drawings illustrate embodiments of the invention and together with the description serve to explain the principles of the invention. In the figures.

DETAILED DESCRIPTION OF THE INVENTION

Figure 1:
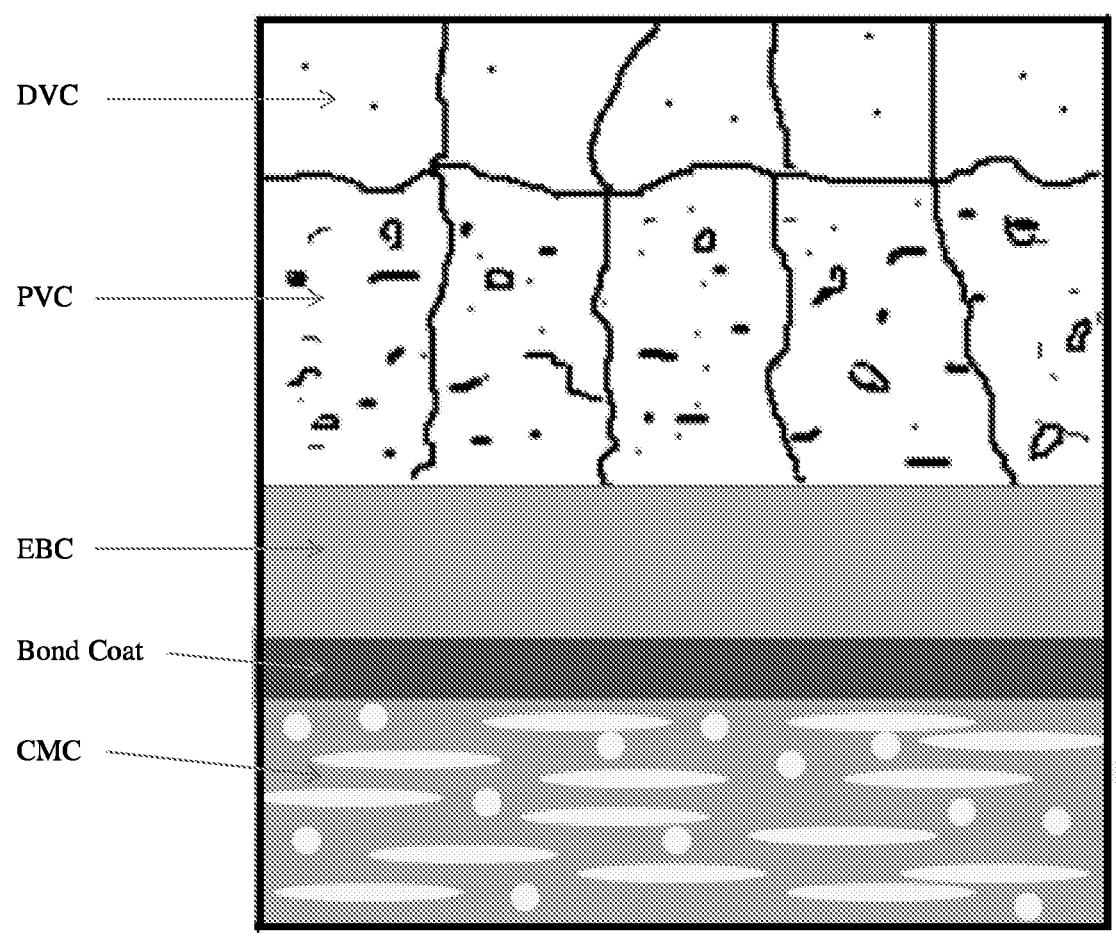
FIG. 1 schematically shows a multi-layer coating in accordance with the invention.

The following detailed description illustrates by way of example, not by way of limitation, the principles of the disclosure. This description will clearly enable one skilled in the art to make and use the disclosure, and describes several embodiments, adaptations, variations, alternatives and uses of the disclosure, including what is presently believed to be the best mode of carrying out the disclosure. It should be understood that the drawings are diagrammatic and schematic representations of exemplary embodiments of the disclosure and are not limiting of the present disclosure nor are they necessarily drawn to scale.

The novel features which are characteristic of the disclosure, both as to structure and method of operation thereof, together with further aims and advantages thereof, will be understood from the following description, considered in connection with the accompanying drawings, in which an embodiment of the disclosure is illustrated by way of example. It is to be expressly understood, however, that the drawings are for the purpose of illustration and description only, and they are not intended as a definition of the limits of the disclosure.

In the following description, the various embodiments of the present disclosure will be described with respect to the enclosed drawings. As required, detailed embodiments of the present disclosure are discussed herein; however, it is to be understood that the disclosed embodiments are merely exemplary of the embodiments of the disclosure that may be embodied in various and alternative forms. The figures are not necessarily to scale and some features may be exaggerated or minimized to show details of particular components. Therefore, specific structural and functional details disclosed herein are not to be interpreted as limiting, but merely as a representative basis for teaching one skilled in the art to variously employ the present disclosure.

The particulars shown herein are by way of example and for purposes of illustrative discussion of the embodiments of the present disclosure only and are presented in the cause of providing what is believed to be the most useful and readily understood description of the principles and conceptual aspects of the present disclosure. In this regard, no attempt is made to show structural details of the present disclosure in more detail than is necessary for the fundamental understanding of the present disclosure, such that the description, taken with the drawings, making apparent to those skilled in the art how the forms of the present disclosure may be embodied in practice.

As used herein, the singular forms "a," "an," and "the" include the plural reference unless the context clearly dictates otherwise. For example, reference to "a powder material" would also mean that mixtures of one or more powder materials can be present unless specifically excluded. As used herein, the indefinite article "a" indicates one as well as more than one and does not necessarily limit its referent noun to the singular.

Except where otherwise indicated, all numbers expressing quantities used in the specification and claims are to be understood as being modified in all examples by the term "about." Accordingly, unless indicated to the contrary, the numerical parameters set forth in the specification and claims are approximations that may vary depending upon the desired properties sought to be obtained by embodiments of the present disclosure. At the very least, and not to be considered as an attempt to limit the application of the doctrine of equivalents to the scope of the claims, each numerical parameter should be construed in light of the number of significant digits and ordinary rounding conventions.

Additionally, the recitation of numerical ranges within this specification is considered to be a disclosure of all numerical values and ranges within that range (unless otherwise explicitly indicated). For example, if a range is from about 1 to about 50, it is deemed to include, for example, 1, 7, 34, 46.1, 23.7, or any other value or range within the range.

As used herein, the terms "about" and "approximately" indicate that the amount or value in question may be the specific value designated or some other value in its neighborhood. Generally, the terms "about" and "approximately" denoting a certain value is intended to denote a range within ±5% of the value. As one example, the phrase "about 100" denotes a range of 100±5, i.e. the range from 95 to 105. Generally, when the terms "about" and "approximately" are used, it can be expected that similar results or effects according to the disclosure can be obtained within a range of ±5% of the indicated value.

As used herein, the term "and/or" indicates that either all or only one of the elements of said group may be present. For example, "A and/or B" shall mean "only A, or only B, or both A and B". In the case of "only A", the term also covers the possibility that B is absent, i.e. "only A, but not B".

The term "at least partially" is intended to denote that the following property is fulfilled to a certain extent or completely.

The terms "substantially" and "essentially" are used to denote that the following feature, property or parameter is either completely (entirely) realized or satisfied or to a major degree that does not adversely affect the intended result.

The term "comprising" as used herein is intended to be non-exclusive and open-ended. Thus, for example a composition comprising a compound A may include other compounds besides A. However, the term "comprising" also covers the more restrictive meanings of "consisting essentially of" and "consisting of", so that for example "a composition comprising a compound A" may also (essentially) consist of the compound A.

The various embodiments disclosed herein can be used separately and in various combinations unless specifically stated to the contrary.

The invention is described with reference to FIG. 1 which schematically shows a multi-layer coating arranged on a CMC substrate. As is evident in FIG. 1, the multi-layer coating utilizes a top coating layer that is a strain tolerant DVC coating top layer. This layer is disposed over an underlying PVC coating system which is used to protect the underlying EBC/CMC layers. The DVC/PVC layers can be composed of tough rare earth element (Re) stabilized $ZrO_2$ or $HfO_2$ mixed with a CMAS resistant chemistry composition. The one or more DVC layers provide erosion resistant and the one or more PVC layers provide the CTE mitigation between the one or more high CTE top layer and the one or more low CTE bottom layers of EBC.

The DVC layer(s) can be composed of tough Re stabilized $ZrO_2$ or $HfO_2$ mixed with CMAS resistant chemistry to improve the erosion and CMAS resistance of the EBC/CMC system. In addition, the PVC strain tolerant transition layer(s) provides CTE mitigation between the high CTE top layer(s) (DVC layer) and the low CTE bottom layer(s) EBC. Next, PVC microstructure further reduces thermal conductivity of the EBC/CMC system.

Non-limiting embodiments of the DVC top layer(s) and/or the PVC layer(s), with the DVC being erosion and CMAS resistant and with the PVC being a thermal barrier and CTE mitigation layer, include the following (with exemplary rare earth oxides including Yttrium oxide, Lanthanum oxide, Cerium oxide, Praseodymium oxide, Neodymium oxide, Samarium oxide, Europium oxide, Gadolinium oxide, terbium oxide, Dysprosium oxide, holmium oxide, erbium oxide, ytterbium oxide, Lutetium oxide, Scandium oxide, Thulium oxide):

Re stabilized $ZrO_2$ or $HfO_2$ mixture with Rare earth oxides; or
Re stabilized $ZrO_2$ or $HfO_2$ mixture with Rare earth Silicate; or
Re stabilized $ZrO_2$ or $HfO_2$ mixture with Rare earth Aluminate; or
Re stabilized $ZrO_2$ or $HfO_2$ mixture with Rare earth Aluminate Silicate; or
Re stabilized $ZrO_2$ or $HfO_2$ mixture with alkaline oxides; or
Re stabilized $ZrO_2$ or $HfO_2$ mixture with Gadolinium Zirconate; or
Any combination of the above.

The DVC top layer(s) or coating can have a CTE of $\sim 10 \times 10^{-6}$/degrees C., as well as a thickness of between 2 mils and 40 mils. This layer or coating can be applied by atmospheric plasma spraying (APS), plasma spray-physical vapor deposition (PS-PVD) or suspension plasma spray (SPS).

The PVC intermediate layer(s) or coating can have a CTE of $\sim 10 \times 10^{-6}$/degrees C., as well as a thickness of between 1 mil and 40 mils. This layer or coating can be applied by atmospheric plasma spraying (APS), plasma spray-physical vapor deposition (PS-PVD) or suspension plasma spray (SPS).

The EBC layer(s) or coating can have a CTE of $3.5-7 \times 10^{-6}$/degrees C., as well as a thickness of between 1 mil and 40 mils. This layer or coating can be applied by atmospheric plasma spraying (APS), plasma spray-physical vapor deposition (PS-PVD) or suspension plasma spray (SPS).

The bond coating layer(s) or coating can be Si, Si—$HfO_2$, Si—Re and can have a CTE of $3.5-4.5 \times 10^{-6}$/degrees C., as well as a thickness of between 0 mils and 10 mils. This layer or coating can be applied by atmospheric plasma spraying (APS), plasma spray-physical vapor deposition (PS-PVD) or suspension plasma spray (SPS).

The CMC or substrate can have a CTE of $\sim 4.5-5.5 \times 10^{-6}$/degrees C., as well as a thickness of greater than 40 mils. The substrate can be a SiC or $Si_3N_4$ material.

In embodiments, the porosity of the DVC layer(s) can be 0% to 5% and the cracks can extend either partially through the thickness of the layer(s), i.e., less than 50% of the thickness, or about 50% of the thickness, and can even extend through an entire thickness of the layer(s). In embodiments, the cracks can be substantially vertical cracks and can range between 20 and 200 cracks per inch or linear inch. In non-limiting embodiments, the DVC layer(s) can also be of a type known in the art and described in one or more of the herein incorporated documents.

In embodiments, the porosity of the PVC layer(s) can be 5% to 25% and the cracks can extend either partially through the thickness of the layer(s), i.e., less than 50% of the thickness, or about 50% of the thickness, and can even extend through an entire thickness of the layer(s). In embodiments, the cracks can be substantially vertical cracks and can range between 20 and 200 cracks per inch or linear inch. In non-limiting embodiments, the PVC layer(s) can also be of a type known in the art and described in one or more of the herein incorporated documents.

NON-LIMITING EXAMPLES

Figure 2:
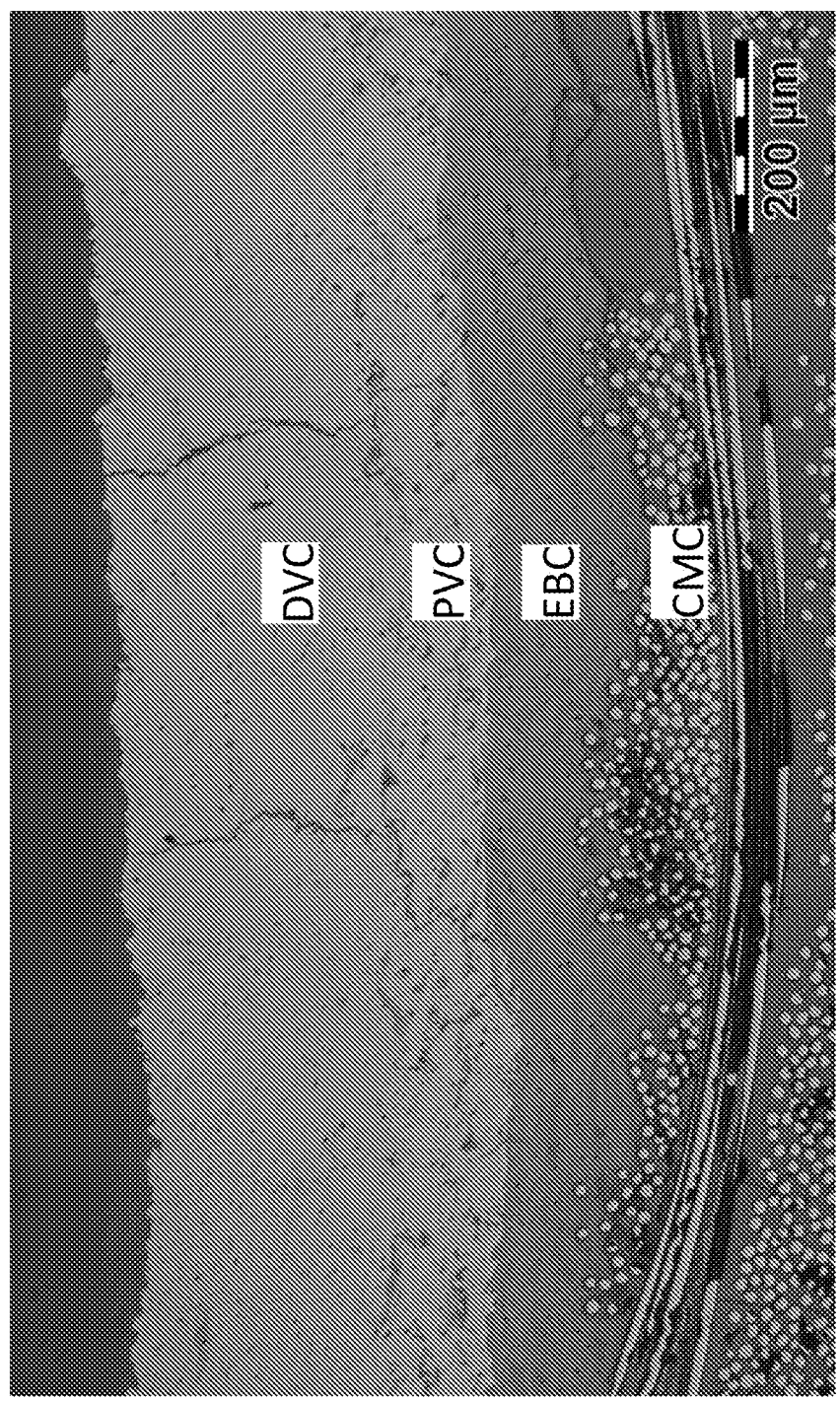
FIG. 2 shows a scanning electron microscope (SEM) cross-section of an applied multi-layer coating in accordance with the invention.

The following tables include a description of the coating system shown in FIG. 2 as well as the parameters used to form the same with a Simplex Plasma Torch.

| Layer | Chemistry composition | Thickness range | Plasma torch | Process |
|---|---|---|---|---|
| CMC substrate | SiC | 2 mm | n/a | n/a |
| EBCs layer | Yb2Si2O7 | ~170 um | SinplexPro ™ | Ar/H2 plasma gas |
| PVC | 7YSZ | ~120 um | SinplexPro ™ | Ar/H2 plasma gas |
| DVC | 7YSZ | ~350 um | SinplexPro ™ | Ar/H2 plasma gas |

| | | EBCs layer | PVC layer | DVC layer |
|---|---|---|---|---|
| Material Composition | | M6157 Yb2Si2O7 | See Examples below 8YSZ | M204F 8YSZ |
| Gun current | Amps | 500 | 540 | 520 |
| Voltage | Volts | 91 | 106 | 100 |
| Gun power | kW | 46 | 57 | 51.4 |
| Argon flow | Nlpm | 70 | 90 | 60 |
| Hydrogen flow | Nlpm | 5 | 7.5 | 7.5 |
| Powder feed rate | g/min × 1 | 20 | 90 | 40 |

Exemplary Embodiment

The follow is an exemplary coating system with improved coating erosion resistance: Erosion test shows that Yb2Si2O7 coating alone has an erosion rate of 9.52 seconds/mil. In contrast, the multilayer system using 8YSZ DVCs/PVCs/EBC has an erosion rate of 19.05 seconds/mil. Thus, with the multilayer DVCs/PVCs/EBCs coating system, the coating erosion resistance is significantly improved compared to Yb2Si2O7 EBCs. Non-limiting examples of the 8YSZ powder materials include Metco 204C-NS Premium, Metco 204NS-G Premium, Metco 204D, Metco 204E, Metco 204NS, Metco 204B-NS, Metco 204AF, Metco 204C-NS, Metco 204F, Metco 204NS-G, and Metco 204NS-AP. Non-limiting examples of the EBCs include Metco 6157.

Further, at least because the invention is disclosed herein in a manner that enables one to make and use it, by virtue of the disclosure of particular exemplary embodiments, such as for simplicity or efficiency, for example, the invention can be practiced in the absence of any additional element or additional structure that is not specifically disclosed herein.

It is noted that the foregoing examples have been provided merely for the purpose of explanation and are in no way to be construed as limiting of the present invention. While the present invention has been described with reference to an exemplary embodiment, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

What is claimed:

1. An erosion and calcium-magnesium-aluminum-silicate (CMAS) resistant coating arranged on an environmental barrier coating (EBC) coated substrate, in which at least one bond coating layer is disposed between the EBC and the substrate, the erosion and CMAS resistant coating comprising:
    at least one porous vertically cracked (PVC) coating layer providing CTE mitigation and being disposed over the EBC coated substrate, the substrate comprising a ceramic matrix composite (CMC); and
    at least one dense vertically cracked (DVC) erosion and CMAS resistant coating layer deposited over the at least one PVC coating layer,
    wherein a porosity of the at least one DVC erosion and CMAS resistant coating is 0% to 5%, and
    wherein a porosity of the at least one PVC coating layer is 5% to 25%.

2. The coating of claim 1, wherein the at least one DVC layer is a top layer.

3. The coating of claim 1, wherein the at least one bond coating layer disposed between the EBC and the substrate comprises at least one of Si, Si-HfO$_2$ or S-rare earth (Re).

4. The coating of claim 1, wherein the substrate is an Si-based CMC substrate.

5. The coating of claim 1, wherein the at least one DVC erosion and CMAS resistant coating layer comprises Re stabilized ZrO$_2$ mixed with rare earth oxide or Re stabilized HfO$_2$ mixed with rare earth oxide.

6. The coating of claim 1, wherein the at least one DVC erosion and CMAS resistant coating layer comprises Re stabilized ZrO$_2$ mixed with rare earth silicate or Re stabilized HfO$_2$ mixed with rare earth silicate.

7. The coating of claim 1, wherein the at least one DVC erosion and CMAS resistant coating layer comprises Re stabilized ZrO$_2$ mixed with rare earth aluminate or Re stabilized HfO$_2$ mixed with rare earth aluminate.

8. The coating of claim 1, wherein the at least one DVC erosion and CMAS resistant coating layer comprises Re stabilized ZrO$_2$ mixed with rare earth aluminate or silicate or Re stabilized HfO$_2$ mixed with rare earth aluminate or silicate.

9. The coating of claim 1, wherein the at least one DVC erosion and CMAS resistant coating layer comprises Re stabilized ZrO$_2$ mixed with alkaline oxide or Re stabilized HfO$_2$ mixed with alkaline oxide.

10. The coating of claim 1, wherein the at least one DVC erosion and CMAS resistant coating layer comprises Re stabilized ZrO$_2$ mixed with gadolinium zirconate or Re stabilized HfO$_2$ mixed with gadolinium zirconate.

11. The coating of claim 1, wherein the at least one DVC erosion and CMAS resistant coating layer comprises a mixture of two or more of:
    Re stabilized ZrO$_2$ mixed with rare earth oxide;
    Re stabilized HfO$_2$ mixed with rare earth oxide;
    Re stabilized ZrO$_2$ mixed with rare earth silicate;
    Re stabilized HfO$_2$ mixed with rare earth silicate;
    Re stabilized ZrO$_2$ mixed with rare earth aluminate;
    Re stabilized HfO$_2$ mixed with rare earth aluminate;
    Re stabilized ZrO$_2$ mixed with rare earth aluminate or silicate;
    Re stabilized HfO$_2$ mixed with rare earth aluminate or silicate;
    Re stabilized ZrO$_2$ mixed with alkaline oxide;
    Re stabilized HfO$_2$ mixed with alkaline oxide;
    Re stabilized ZrO$_2$ mixed with gadolinium zirconate; or
    Re stabilized HfO$_2$ mixed with gadolinium zirconate.

12. The coating of claim 1, wherein the at least one DVC erosion and CMAS resistant coating layer comprises full thickness vertical cracks.

13. The coating of claim 1, wherein the at least one PVC coating layer comprises full thickness vertical cracks.

14. The coating of claim 1, wherein:
    the substrate is a CMC substrate;
    the EBC coated substrate comprises an EBC coating layer bonded to the substrate;
    the at least one PVC coating layer is a PVC ceramic coating layer directly deposited on the EBC coating layer; and
    the at least one DVC erosion and CMAS resistant coating layer is deposited directly on the PVC coating layer.

15. A method of plasma spraying the erosion and CMAS resistant coating of claim 1 on the EBC coated substrate, in which the at least one bond coating layer is disposed between the EBC and the substrate, the method comprising:
    depositing the at least one PVC coating layer as a PVC thermal barrier coating layer providing CTE mitigation onto the EBC coated substrate; and
    depositing the at least one DVC erosion and CMAS resistant coating material over the at least one PVC thermal barrier coating layer.

16. The method of claim 15, wherein the at least one bond coating layer arranged between an EBC layer and the substrate comprises at least one of Si, Si—HfO$_2$ or S-Re.

17. The method of claim 16, wherein the plasma spraying comprises one of:
   atmospheric plasma spraying (APS);
   plasma spray-physical vapor deposition (PS-PVD); or
   suspension plasma spray (SPS).

18. An erosion and calcium-magnesium-aluminum-silicate (CMAS) resistant coating arranged on an environmental barrier coating (EBC) coated substrate, in which at least one bond coating layer is disposed between the EBC and the substrate, the erosion and CMAS resistant coating comprising:
   at least one porous vertically cracked (PVC) thermal barrier coating layer providing coefficient of thermal expansion (CTE) mitigation and being disposed over the EBC coated substrate, the substrate comprising a ceramic matrix composite (CMC); and
   a top layer of dense vertically cracked (DVC) erosion and CMAS resistant coating material deposited over the at least one PVC thermal barrier coating layer,
   wherein a porosity of the at least one DVC erosion and CMAS resistant coating material is 0% to 5%, and
   wherein a porosity of the at least one PVC thermal barrier coating layer is 5% to 25%.

19. The coating of claim 18, wherein the at least one bond coating layer disposed between the EBC and the substrate comprises at least one of Si, Si—$HfO_2$ or S-Re.

20. The coating of claim 18, wherein the substrate is an Si-based CMC substrate.

21. The coating of claim 18, wherein the at least one DVC erosion and CMAS resistant coating layer comprises Re stabilized $ZrO_2$ mixed with rare earth oxide or Re stabilized $HfO_2$ mixed with rare earth oxide.

22. The coating of claim 18, wherein the at least one DVC erosion and CMAS resistant coating layer comprises Re stabilized $ZrO_2$ mixed with rare earth silicate or Re stabilized $HfO_2$ mixed with rare earth silicate.

23. The coating of claim 18, wherein the at least one DVC erosion and CMAS resistant coating layer comprises Re stabilized $ZrO_2$ mixed with rare earth aluminate or Re stabilized $HfO_2$ mixed with rare earth aluminate.

24. The coating of claim 18, wherein the at least one DVC erosion and CMAS resistant coating layer comprises Re stabilized $ZrO_2$ mixed with rare earth aluminate or silicate or Re stabilized $HfO_2$ mixed with rare earth aluminate or silicate.

25. The coating of claim 18, wherein the at least one DVC erosion and CMAS resistant coating layer comprises Re stabilized $ZrO_2$ mixed with alkaline oxide or Re stabilized $vHfO_2$ mixed with alkaline oxide.

26. The coating of claim 18, wherein the at least one DVC erosion and CMAS resistant coating layer comprises Re stabilized $ZrO_2$ mixed with gadolinium zirconate or Re stabilized $HfO_2$ mixed with gadolinium zirconate.

27. The coating of claim 18, wherein the at least one DVC erosion and CMAS resistant coating layer comprises a mixture of two or more of:
   Re stabilized $ZrO_2$ mixed with rare earth oxide;
   Re stabilized $HfO_2$ mixed with rare earth oxide;
   Re stabilized $ZrO_2$ mixed with rare earth silicate;
   Re stabilized $HfO_2$ mixed with rare earth silicate;
   Re stabilized $ZrO_2$ mixed with rare earth aluminate;
   Re stabilized $HfO_2$ mixed with rare earth aluminate;
   Re stabilized $ZrO_2$ mixed with rare earth aluminate or silicate;
   Re stabilized $HfO_2$ mixed with rare earth aluminate or silicate;
   Re stabilized $ZrO_2$ mixed with alkaline oxide;
   Re stabilized $HfO_2$ mixed with alkaline oxide;
   Re stabilized $ZrO_2$ mixed with gadolinium zirconate; or
   Re stabilized $HfO_2$ mixed with gadolinium zirconate.

28. The coating of claim 18, wherein the top layer of DVC erosion and CMAS resistant coating layer comprises full thickness vertical cracks.

29. The coating of claim 18, wherein the at least one PVC coating layer comprises full thickness vertical cracks.

* * * * *